(12) United States Patent
Ono et al.

(10) Patent No.: US 10,043,997 B2
(45) Date of Patent: Aug. 7, 2018

(54) ENCAPSULATION DESIGN FOR NARROW BORDER

(71) Applicant: Apple Inc., Cupertino, CA (US)

(72) Inventors: Shinya Ono, Cupertino, CA (US); Tsung-Ting Tsai, Santa Clara, CA (US); Chin-Wei Lin, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/339,324

(22) Filed: Oct. 31, 2016

(65) Prior Publication Data
US 2018/0069194 A1    Mar. 8, 2018

Related U.S. Application Data

(60) Provisional application No. 62/385,128, filed on Sep. 8, 2016.

(51) Int. Cl.
| | | |
|---|---|---|
| H01L 29/08 | (2006.01) | |
| H01L 51/00 | (2006.01) | |
| H01L 51/52 | (2006.01) | |
| G09G 3/3266 | (2016.01) | |
| H01L 27/32 | (2006.01) | |

(52) U.S. Cl.
CPC ....... *H01L 51/5253* (2013.01); *G09G 3/3266* (2013.01); *H01L 27/326* (2013.01); *H01L 27/3246* (2013.01); *H01L 27/3276* (2013.01); *G09G 2310/08* (2013.01); *G09G 2330/04* (2013.01)

(58) Field of Classification Search
CPC ............. H01L 51/5253; H01L 27/3246; H01L 27/3276
USPC ............................. 257/40, E51.022, E51.02
See application file for complete search history.

(56) References Cited

U.S. PATENT DOCUMENTS

| 9,093,023 | B1 | 7/2015 | Kim et al. | |
|---|---|---|---|---|
| 9,147,719 | B2 | 9/2015 | Kim et al. | |
| 2012/0162053 | A1* | 6/2012 | Lee | H01L 27/3276 345/80 |
| 2015/0055047 | A1 | 2/2015 | Chang et al. | |
| 2015/0243718 | A1 | 8/2015 | Kwon et al. | |
| 2016/0035812 | A1 | 2/2016 | Kwon et al. | |
| 2016/0111040 | A1 | 4/2016 | Kim et al. | |
| 2016/0172428 | A1 | 6/2016 | Song et al. | |
| 2016/0179229 | A1 | 6/2016 | Ahn | |
| 2016/0247456 | A1 | 8/2016 | Lin et al. | |
| 2017/0069871 | A1* | 3/2017 | Yim | H01L 51/5056 |

* cited by examiner

*Primary Examiner* — Robert Huber
(74) *Attorney, Agent, or Firm* — Jaffery Watson Mendonsa & Hamilton LLP

(57) ABSTRACT

Display panels and encapsulation structures are described for OLED display panels, in particular. In an embodiment, a display panel includes a gate driver in panel (GIP) region, a GIP clock region within the GIP region, a pixel area region, and a VSSEL contact region laterally between an outer edge of the GIP region and the pixel area region. In some embodiments, structures are described in which capacitive coupling with the GIP clock region can be mitigated, and overlapping inorganic layers form a barrier to moisture outside of the pixel area region.

21 Claims, 9 Drawing Sheets

ENCAPSULATION DESIGN FOR NARROW BORDER

RELATED APPLICATIONS

This application claims the benefit of priority of U.S. Provisional Application No. 62/385,128 filed Sep. 8, 2016, which is incorporated herein by reference.

BACKGROUND

Field

Embodiments described herein relate to active matrix displays, and more specifically to encapsulation structures for OLED display panels.

Background Information

An active matrix display backplane for organic light emitting diode (OLED) displays commonly includes a gate driver in panel (GIP) region and a pixel area region. For example, the GIP region may include gate driver circuitry connected to gate lines that run horizontally through the pixel area region, with each gate line corresponding a respective row of the display pixels. The GIP is commonly located on the left or right side of the display panel, or on both sides.

SUMMARY

Display panels and encapsulation structures are described. In an embodiment, a display panel includes a gate driver in panel (GIP) region, a pixel area region, and a negative supply electrode (VSSEL) contact region laterally between an outer edge of the GIP region and the pixel area region. In accordance with embodiments, the VSSEL contact region may include various structural features, for example, to reduce capacitive coupling with GIP clock signals, facilitate encapsulation of organic layers and protect against moisture, and provide structural integrity of the display adjacent scribe lines.

DETAILED DESCRIPTION

Figure 1:
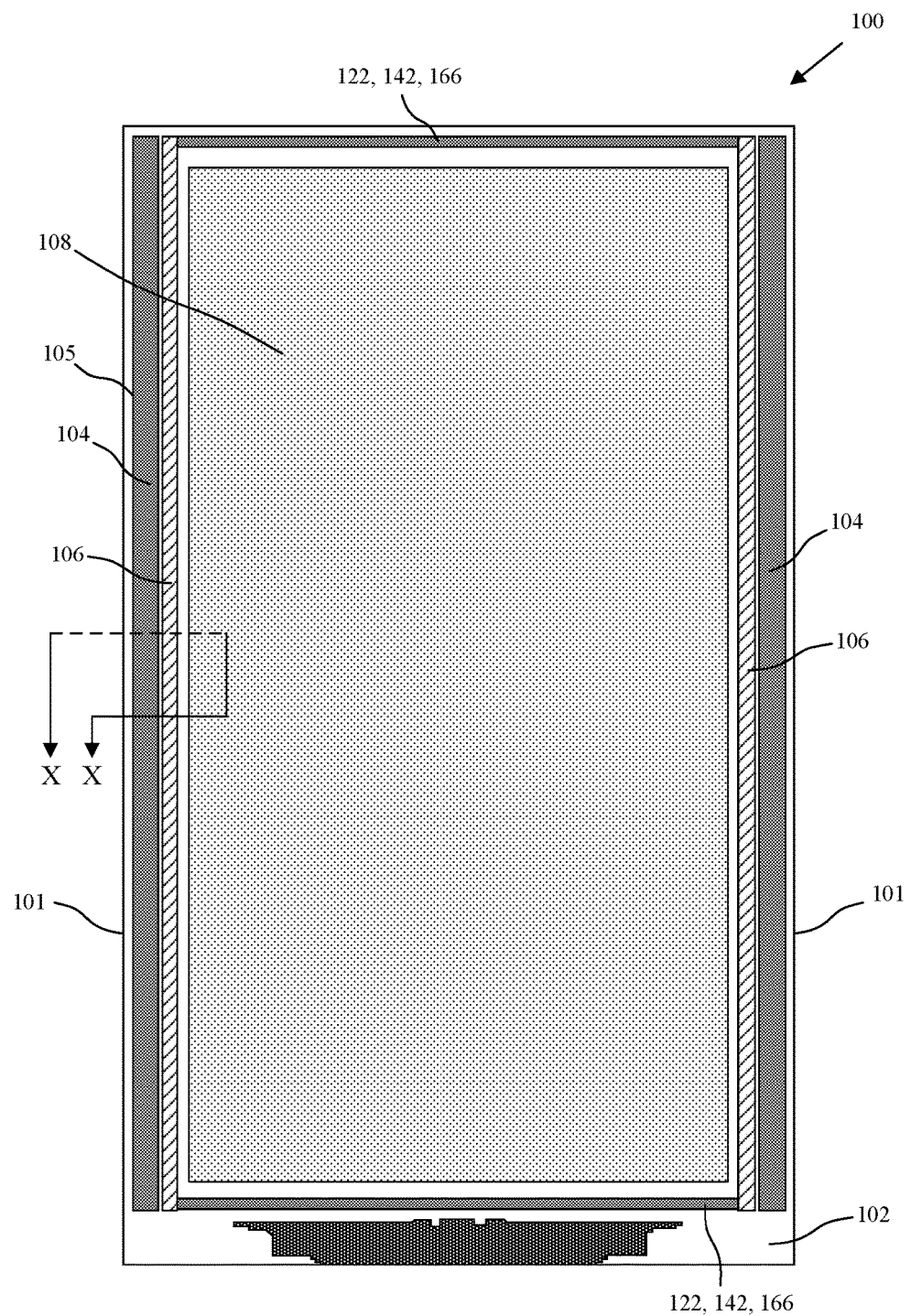
FIG. 1 is a schematic top view illustration of an active matrix display panel including GIP regions and VSSEL contact regions in accordance with an embodiment.

Embodiments describe display panels and encapsulation structures for OLED display panels, in particular. In one aspect, display panels are described in which the metal layer forming the anode contacts in the pixel area region does not overlap the GIP clock region of a GIP region. In this manner, capacitive coupling between the metal layer and the GIP clock signals can be mitigated. In one embodiment, the display panel includes a first metal layer spanning the VSSEL contact region and the pixel area region. The first metal layer includes an array of anode contacts in the pixel area region and a VSSEL contact layer in the VSSEL contact region. The display panel may additionally include a cathode layer over the pixel area region and on the VSSEL contact layer in the VSSEL contact region, while the VSSEL contact layer does not span over the GIP clock region.

In another aspect, display panels are described in which VSSEL lines do not overlap the GIP clock lines, which additionally mitigates capacitive coupling between the GIP clock signals and VSSEL. In one embodiment, the display panel includes VSSEL lines spanning the VSSEL contact region and the pixel area region, and the VSSEL contact layer is on and in electrical contact with the VSSEL lines in the VSSEL contact region. In such an arrangement, VSSEL bus lines can be removed from the display panel, such that VSSEL bus lines are not located outside of and do not overlap the GIP clock region.

In one aspect, display panels are described in which the layer stack includes a barrier against moisture and outgassing formed by overlapping inorganic layers outside of the pixel area. For example, the barrier may be formed by a layer stack of metal and inorganic dielectric layers. This may provide moisture protection to the emissive organic layers within the OLED pixels that are commonly sensitive to moisture. Furthermore, stack-up structures are provided that may provide structural integrity to the display panel during scoring and handling with equipment. For example, deep valleys extending through multiple planarization layers are not included near, or outside of the GIP region. Additionally, structures may be included to confine the cathode layer to the pixel area region, and away from the GIP region. In this manner, cracking near the panel edges that may potentially result from scoring or handling with equipment may be confined to edges of the panel that do not overlap the cathode layer or the lateral moisture barrier that is created by the overlapping inorganic layers.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer or feature with respect to other layers or features. One layer or feature "over", "spanning", "on", "connected to", or "coupled to" another layer or feature may be directly in contact with the other layer or feature, or may have one or more intervening layers or features. One layer or feature "between" layers or features may be directly in contact with the layers or features, or may have one or more intervening layers or features.

FIG. 1 is a schematic top view illustration of an active matrix display panel 100 in accordance with an embodiment. As shown, the display panel 100 includes GIP regions 104, pixel area region 108 and VSSEL contact regions 106 laterally between the out edge 105 of GIP regions 104 and the pixel area region 108. In the particular embodiment illustrated, the GIP regions 104 and VSSEL contact regions 106 are illustrated on both the left and right sides of the display panel 100 though they may be located only on one side, or both as illustrated. As shown, the GIP regions 104 and VSSEL contact regions 106 may extend along a longitudinal length (e.g., vertical, column length) of the display panel. The GIP regions 104 and VSSEL contact regions 106 may be parallel to one another, and side edges 101 of the display substrate 102. For example, the side edges 101 may correspond to scribe regions in which multiple display panels 100 are singulated from a common display substrate 102.

Figure 2:
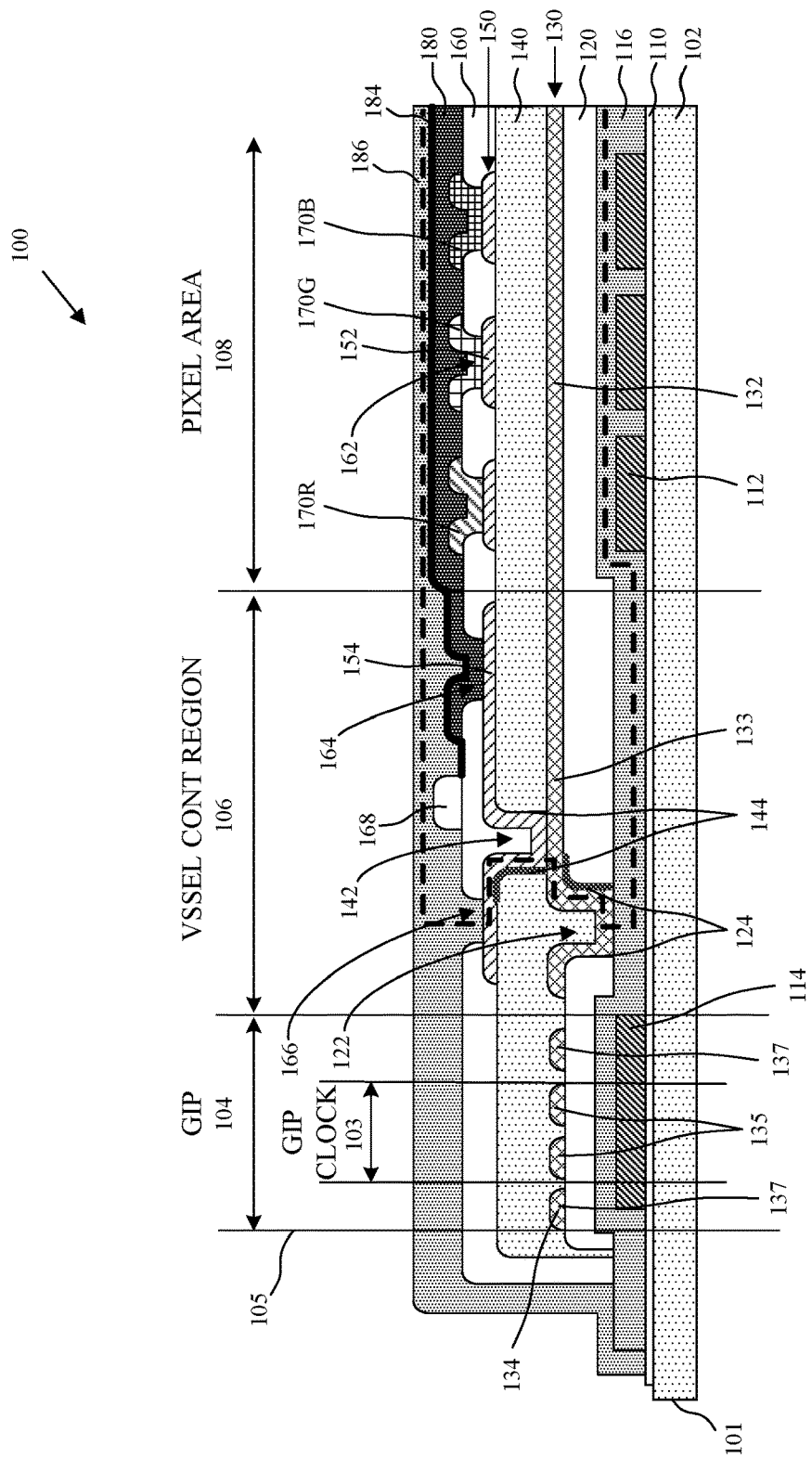
FIGS. 2-7 are cross-sectional side view illustrations of various display panel encapsulation structures taken along line X-X of FIG. 1 in accordance with embodiments.

Referring now to FIG. 2 a cross-sectional side view illustration is provided of a display panel 100 encapsulation structure taken along line X-X of FIG. 1 in accordance with an embodiment. The display panel includes a display substrate 102 such as glass or plastic. A buffer layer 110 may optionally be formed on the display substrate 102. Buffer layer 110 may optionally be formed of a materials such as silicon nitride (SiNx) or silicon oxide (SiOx), or combinations thereof. Thin film transistors (TFTs) 114 and 112 may then be formed over the display substrate 102. For example, the TFTs may be silicon channel TFTs, oxide TFTs, or combinations of silicon TFTs and oxide TFTs. TFTs 114 may form part of a gate driver circuitry for the GIP region 104. TFTs 112 may form part of the display pixel circuitry. A passivation layer 116 is formed over the display substrate 102 and over the TFTs 114, 112. In an embodiment, passivation layer 116 is formed of an inorganic dielectric material such as SiNx. In an embodiment, passivation layer 116 is formed using a conformal deposition technique such as chemical vapor deposition (CVD), sputtering, or evaporation. In accordance with embodiments, a passivation layer 116 formed of an inorganic material may function as a lower barrier to moisture encroachment.

In the following description, references are made to moisture barriers. Such a moisture barrier is illustrated in each of FIGS. 2-7 as a hashed line. As shown the hashed line encapsulates the organic emission layers, as well as other layers within an interior of the display panel 100 and within the pixel area 108. In the close-up cross sectional side views, the hashed lines illustrate top, bottom, and lateral moisture barriers created by overlapping layers of inorganic materials. Furthermore, illustration of the lateral moisture barriers is exaggerated with the illustrated of two "L" shaped regions (which may be inverted vertically or horizontally) adjacent openings in planarization layers.

Still referring to FIG. 2, a first planarization layer 120 is formed over the passivation layer 116 and then patterned to from a first trench 122 completely through the first planarization layer 120. In an embodiment, the first planarization layer 120 is formed of an organic material. In an embodiment, the first planarization layer 120 is formed using a suitable technique such as slot coating, and may be formed using a suitable material such as acrylic.

A second metal layer 130 may then be formed over the first planarization layer 120 and within the first trench 122.

In accordance with embodiments, the second metal layer 130 and trench 122 may partially function as a lateral moisture barrier to the pixel area region 108. For example, this is exaggerated by the illustrated of the inverted "L" shape along interior sidewall 124 of the first trench 122 sidewalls 124. In accordance with embodiments, the second metal layer 130 may include a VSSEL line 132 spanning the VSSEL contact region 106 and the pixel area region 108. The second metal layer 130 may include a plurality of VSSEL lines 132 extending across the pixel area region 108. In an embodiment, the plurality of VSSEL lines 132 are connected by a landing area 133 of the second metal layer 130. The second metal layer 130 may additionally include source-drain contacts 134 to the TFTs 114 within the GIP region 104. As illustrated, the second metal layer 130 may also include a plurality of GIP clock lines 135 and GIP signal lines 137. The GIP clock lines 137 may be located within a GIP clock region 103 of the GIP region 104.

A second planarization layer 140 may then be formed over the first planarization layer 120 and the second metal layer 130, and then patterned to from a second trench 142 completely through the second planarization layer 140 to expose the first metal layer 130. In an embodiment, the second trench 142 may expose a landing area 133 of the second metal layer 130 that is connected to a plurality of VSSEL lines 132 that extend across the pixel area region 108. In an embodiment, the second planarization layer 140 is formed of an organic material, and may be formed similarly as the first planarization layer, and of the same material.

A first metal layer 150 may then be formed over the second planarization layer 140, within the second trench 142, and on the second metal layer 130. In an embodiment, the first metal layer 150 is formed on the landing area 133 of the second metal layer 130.

In accordance with embodiments, the first metal layer 150 and second trench 142 may partially function as a lateral moisture barrier to the pixel area 108. For example, this is exaggerated by the illustrated of the inverted "L" shape along interior sidewall 144 of the second trench 142 sidewalls 144. In accordance with embodiments, the first metal layer 150 may include an array of anode contacts 152 in the pixel area region 108 and a VSSEL contact layer 154 in the VSSEL contact region 106. In an embodiment, the VSSEL contact layer 154 is not formed over the GIP clock region 103. In an embodiment, the VSSEL contact layer 154 is not formed over the GIP region 104 at all.

Referring now to FIG. 2 in combination with FIG. 1, as previously described the VSSEL contact region 106 may extend a longitudinal length of the display panel parallel to the GIP region 104. Similarly, the first trench 122, first landing area 133, second trench 142, and VSSEL contact layer 154 may extend a longitudinal length of the display panel in order to provide lateral encapsulation. Furthermore, the first trench 122, first landing area 133, second trench 142, and VSSEL contact layer 154 may extend along a lateral length (e.g. horizontal, row length) of the display substrate 102, and may completely surround the pixel area 108.

In accordance with embodiments, the relative location of the first and second trenches 122, 142 may be adjusted to determine width of the VSSEL contact region 106. In an embodiment, the second trench 142 does not overlap (e.g., is not formed directly over) the first trench 122. In an embodiment, the second trench 142 can overlap the first trench 122 (e.g. as an unlanded via), in order to reduce overall width of the VSSEL contact region 106.

In accordance with embodiments, the formation of separate first and second trenches 122, 142 can be used to provide greater structural integrity compared to a structure including a trench through both planarization layers, since the trenches may be both comparatively narrower (e.g., less than 10 µm wide, or more specifically less than 5 µm wide) and shallower. The reduced width of the separate first and second trenches 122, 142 may additionally facilitate reduction of the overall width of the VSSEL contact region 106.

Following the formation of the first metal layer 150, a pixel defining layer (PDL) 160 is formed over the first metal layer 150 and the second planarization layer 140. The PDL 160 may include an array of pixel openings 162 within the pixel area region 108. The PDL 160 may additionally include a VSSEL contact opening 164 within the VSSEL contact region 106, and a PDL valley 166 formed completely through the PDL 160 and exposing the first metal layer 150. For example, the PDL valley 166 may expose the VSSEL contact layer 154 on a top surface of the second planarization layer 140. In accordance with embodiments, the PDL valley 166 may be formed in the VSSEL contact region 106, or even the GIP region 104. The PDL valley 166 may extend a longitudinal length of the display panel (e.g., parallel to the GIP region 104) in order to provide lateral encapsulation, as well as a lateral length, and may completely surround the pixel area 108.

A spacer layer 168 may then be formed on the PDL 160. The spacer layer 168 may correspond to a photo spacer layer, for example, for use with aligning a fine metal mask (FMM) for deposition of the emissive organic layers 170R (red), 170G (green), and 170B (blue). It is to be appreciated, that the illustration of an arrangement red, green, and blue subpixels in an RGB pixel is exemplary and embodiments are not so limited. When the display panel is viewed in the entire cross-section, a plurality of spacer layers may be formed across the pixel area 108 for aligning the FMMs when depositing the emissive organic layers onto the anodes contacts 152. In the embodiments illustrated, the spacer layers 168 may be formed on the PDL 160 within the VSSEL contact region 106. In an embodiment, the spacer layers 168 may extend a longitudinal length of the display panel (e.g., parallel to the GIP region 104), as well as a lateral length, and may completely surround the pixel area 108.

In an embodiment, the PDL 160 and spacer layer 168 may be formed on an organic material, and may be formed using a technique such as slot coating. In an embodiment, PDL 160 and spacer layer 168 are formed of the same layer and are patterned using a two toned mask.

Following the formation of the PDL 160 and spacer layer 168 a plurality of organic emissive layers 170R, 170G, 170B are deposited, for example evaporated through a plurality of FMMs. A cathode layer 180 is then formed over the pixel area 108 and in contact with the plurality of organic emissive layers, for example using a suitable technique such as evaporation. In an embodiment, the cathode layer is formed of materials such as Mg, Ag, Al, Ca and/or alloys thereof such as MgAg. An organic capping layer 184 may then be over the cathode layer 180, for example, to prevent a significant amount of light from being lost due to total reflection. The organic capping layer 184 may be formed of an material such as an arylenediamine derivative, a triamine derivative, 4,4-N,N'-dicarbazole-biphenyl (CBP), and/or aluminum quinolate (Alq3), for example. In an embodiment, the organic capping layer 184 is formed using vacuum deposition or evaporation. In accordance with embodiments, the spacer layer 168 may at least partially function to contain the organic capping layer 184 near the pixel area region 108 and away from the GIP region 104.

A thin film encapsulation (TFE) layer 186 may then be formed over the substrate stack. As shown, the TFE layer 186 is formed over the GIP region 104, VSSEL contact region 106, and the pixel area region 108. In an embodiment, the TFE layer 186 is formed of an inorganic material, such as SiNx, in order to function as a moisture barrier for the top side of the display panel 100. TFE layer 186 may include multiple layers, for example, SiNx and SiOx layers. In embodiment, TFE layer 186 is formed using CVD.

In accordance with embodiments, the display panel 100 structure illustrated in FIG. 2 includes various structural features, for example, to reduce capacitive coupling with GIP clock signals, facilitate encapsulation of organic layers and protect against moisture, and provide structural integrity of the display adjacent scribe lines. For example, with regard to scribing along edges 101, the cathode layer 180 is located internally away from the edges 101 and GIP region 104. Additionally, the cathode layer 180 is not located along a deep trench or via region that extends through multiple planarization layers. In this manner, the cathode layer 180 may be protected and potentially less susceptible to cracking due to stress or handling equipment, compared to some conventional OLED stack-up structures.

In accordance with embodiments, rather than locating a VSSEL bus line outside or within the GIP region 104, VSSEL lines 132 are connected to a landing area 133 of the second metal layer 130 located within the VSSEL contact region 106. In this manner, a VSSEL bus line is not included in the GIP region 104 or laterally outside of the GIP region 104, and capacitive coupling with the GIP clock signals can be reduced.

Additionally, in accordance with embodiments, stack-up structures are described that facilitate encapsulation of organic layers and protect against moisture and outgassing. As illustrated, overlapping layer of inorganic materials (e.g., metal layers and inorganic dielectric layers) can provide bottom, top, and lateral encapsulation for the display panel 100 and emissive organic layers. In addition, the stack-up structures may provide for an encapsulation design with narrow border along the display panel edges 101. For example, while the first trench 122, and second trench 142 may not overlap, the depth of the first and second trenches 122, 142 may be limited to a single planarization layer. As a result of the reduced depth, the required width of the first and second trenches 122, 142 can be low, such as less than 10 µm, or less than 5 µm resulting in a narrow border around the pixel area 108. In other embodiments, the second trench 142 can overlap the first trench 122 (e.g. as an unlanded via), in order to reduce overall width of the VSSEL contact region 106. In an embodiment, a total trench width between outermost sidewalls of the first trench 122 and second trench 142 is less than 10 µm wide.

Referring now to FIGS. 2-7 cross-sectional side view illustrations are provided of various display panel encapsulation structures taken along line X-X of FIG. 1 in accordance with embodiments. In interest of conciseness, and to not obscure the embodiments, a separate discussion is not provided of features illustrated in FIG. 3-7 that are similar to those illustrated and described with regard to FIG. 2, and instead the follow discussion is made with regard to relative differences in the figures.

In the embodiment illustrated in FIG. 2, the first trench 122 is located toward an exterior of the display panel 100, with the second trench 142 located laterally internal to the first trench 122, the PDL valley 166 is located external to the second trench 142, and the VSSEL contact opening 164 is located internal to the second trench 142. In the embodiment illustrated, the PDL valley 166 is located directly above the first trench 122, though this is not required. The PDL valley 166 may be located laterally internal or external to the first trench. For example, location of the PDL valley 166 laterally external to the first trench (e.g., within the GIP region 104) may allow for further reduction of the VSSEL contact region 106 width.

Figure 3:
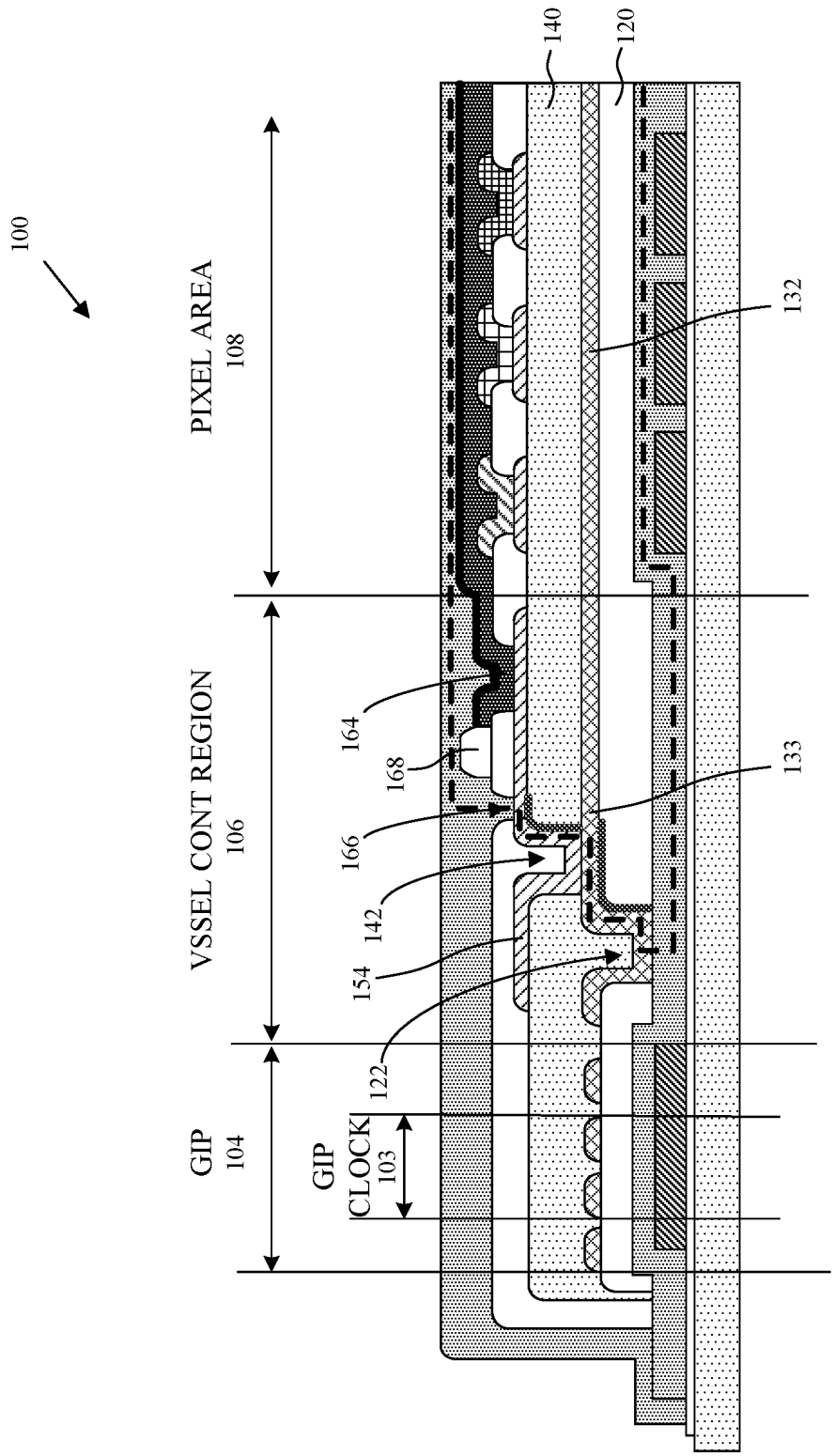

In the embodiment illustrated in FIG. 3, the first trench 122 is located toward an exterior of the display panel 100, with the second trench 142 located laterally internal to the first trench 122, the PDL valley 166 is located laterally internal to the second trench 142, and the VSSEL contact opening 164 is located internal to both the second trench 142 and the PDL valley 166. In such an arrangement as illustrated, the trenches 122, 142, PDL valley 166, and VSSEL contact opening 164 are arranged laterally, in order. In other embodiments, the arrangement of the trenches, valley, and opening are not arranged laterally, in order.

Figure 4:
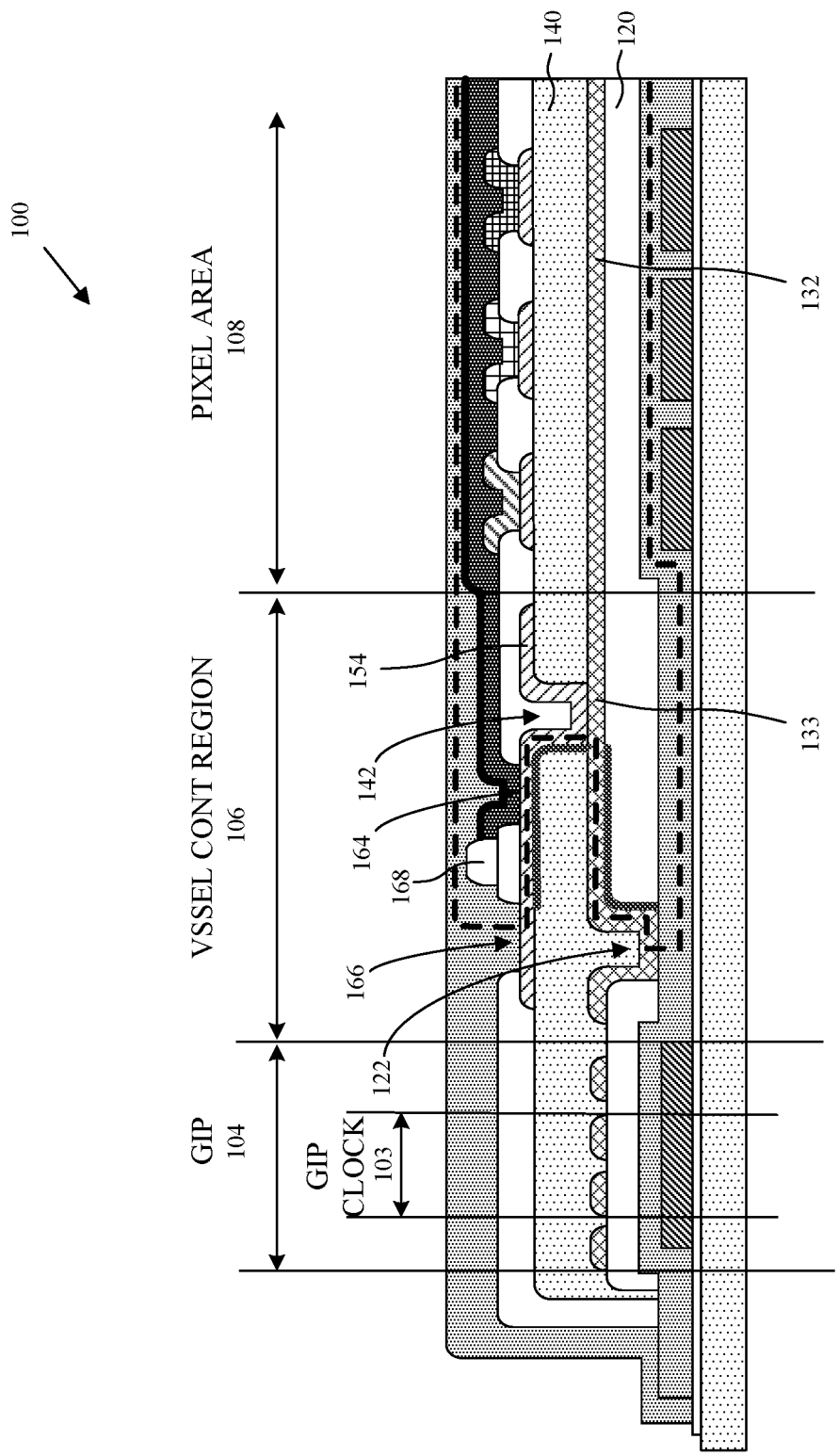

In the embodiment illustrated in FIG. 4, the first trench 122 is located toward an exterior of the display panel 100, with the second trench 142 located laterally internal to the first trench 122, the VSSEL contact opening 164 is laterally between the first trench 122 and the second trench 142, and the PDL valley 166 is laterally external to the VSSEL contact opening 164. In accordance with embodiments, the PDL valley 166 may be located within the VSSEL contact region 106, as illustrated, or within the GIP region 104.

Figure 5:
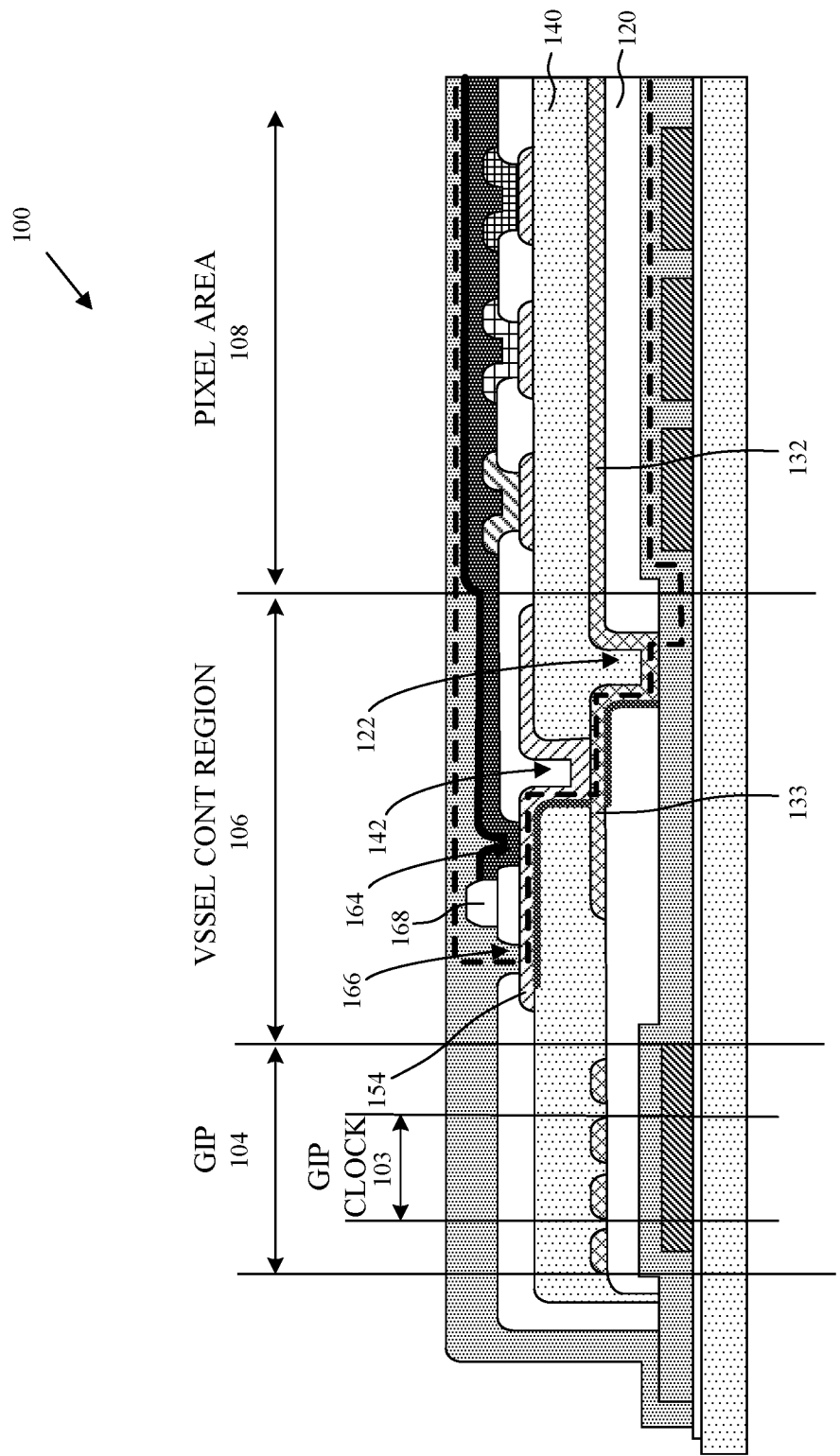

The embodiment illustrated in FIG. 5 is similar to FIG. 4 with the location of the first trench 122 moved internally, with the second trench 142 external to the first trench 122, the VSSEL contact opening 164 external to the second trench 142, and the PDL valley 166 external to the VSSEL contact opening 164.

Figure 6:
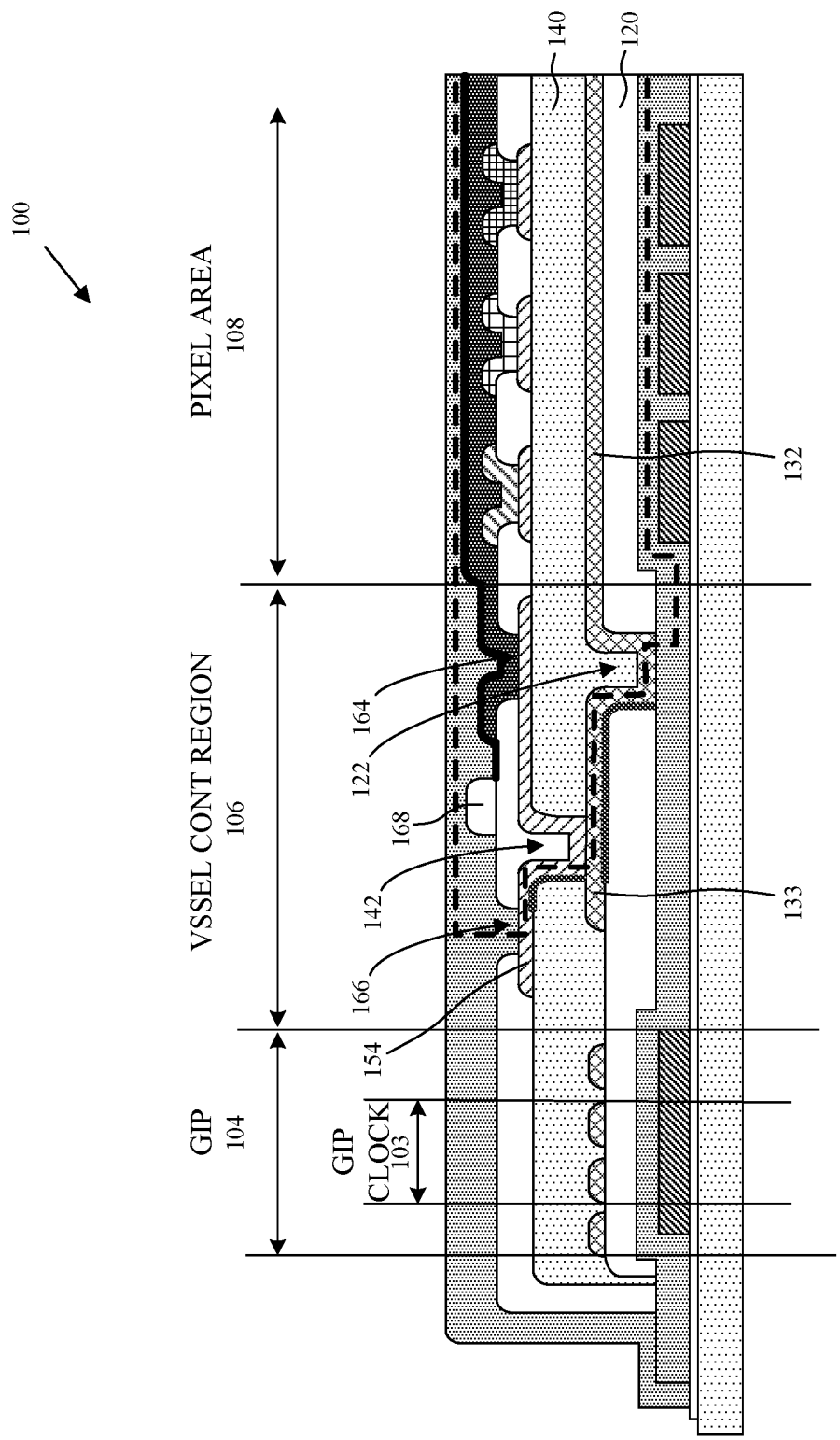

In the embodiment illustrated in FIG. 6, the first trench 122 is located internally, with the second trench 142 external to the first trench 122, and the PDL valley 166 external to the second trench 142. As illustrated, the VSSEL contact opening 164 may be internal to the PDL valley 166 and the second trench 142. The VSSEL contact opening 164 may overlap the first trench 122 or be located laterally internal or external to the first trench 122.

Figure 7:
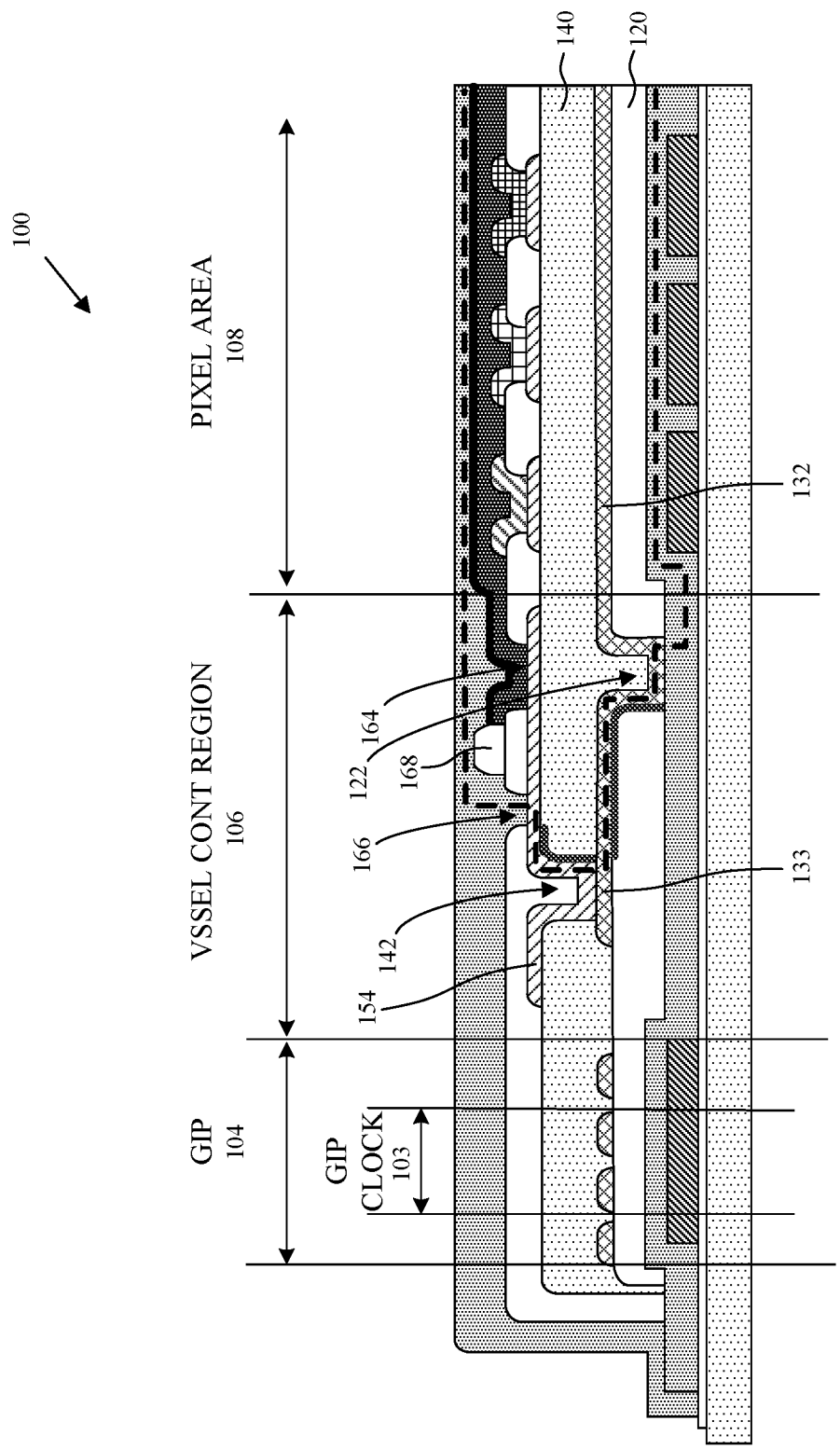

In the embodiment illustrated in FIG. 7, the first trench 122 is located internally, with the second trench 142 external to the first trench 122, and the PDL valley 166 internal to the second trench 142. As illustrated, the VSSEL contact opening 164 may be internal to the PDL valley 166 and the second trench 142. The VSSEL contact opening 164 may overlap the first trench 122 or be located laterally internal or external to the first trench 122.

The above descriptions of FIGS. 2-7 with regard to locations of the trenches, openings, valleys, etc. is meant to be illustrative rather than limiting of various configurations that are possible in accordance with embodiments. As illustrated and described, various configurations of trenches, openings, valleys, etc. with regard to each other, as internal to one another, external to one another, or overlapping are possible to adjust a width of the VSSSEL contact region 106, as well as to adjust location of the cathode layer, etc.

In an embodiment, a display panel 100 includes a GIP region 104, a GIP clock region 103 within the GIP region 104, a pixel area region 108, and a VSSEL contact region 106 laterally between an outer edge of the GIP region 104 and the pixel area region 108. One or more GIP clock lines are located in the GIP clock region. A first metal layer 150 spans the VSSEL contact region 106 and the pixel area region 108, the first metal layer 150 including an array of anode contacts 152 in the pixel area region 108 and a VSSEL contact layer 154 in the VSSEL contact region 106. A cathode layer 180 is over the pixel area region 108 and on the VSSEL contact layer 154 in the VSSEL contact region 106. In an embodiment, the VSSEL contact layer 154 does not span over the GIP region 104.

In accordance with embodiments, the first metal layer 150 does not span over the GIP clock region 103. For example, the VSSEL contact layer 154 does not span over the GIP clock region 103. In some embodiments, the first metal layer (e.g. VSSEL contact layer 154) does not span over the GIP region 104 at all, though in other embodiments the first metal layer (e.g. VSSEL contact layer 154) may span over a portion of the GIP region 104 not including the GIP clock region 103.

The display panel 100 may additionally include a second metal layer 130 including a VSSEL line 132 spanning the pixel area region 108, with the VSSEL contact layer 154 in electrical contact with the VSSEL line 132. In accordance with embodiments, the second metal layer 130 may include a plurality of VSSEL lines 132 spanning the pixel area region 108, and the VSSEL contact layer is in electrical contact with the plurality of VSSEL lines 132. The VSSEL line(s) 132 may optionally span across a portion of the VSSEL contact region 106. In an embodiment, the VSSEL lines(s) 132 are connected to a landing area 133 of the second metal layer 130 in the VSSEL contact region 106. In an embodiment, the VSSEL contact layer 154 and the VSSEL line(s) 132 do not span directly over a transistor 114 in the GIP region 104. In an embodiment, the VSSEL contact layer 154 and the VSSEL line(s) 132 do not overlap the GIP region 104. In an embodiment, the VSSEL contact layer 154 and the VSSEL line(s) 132 do not span directly over a GIP clock line 135 in the GIP clock region 103.

In accordance with embodiments, there is no contact structure between the first metal layer 150 and the second metal layer 130 in the pixel area region 108. More specifically, the VSSEL contact layer 154 does not contact the landing area 133 of the second metal layer 130 within the pixel area region 108.

The display panel 100 may additionally include a first planarization layer 120, and a second planarization layer 140, in which both the first and second planarization layers 120, 140 span across the GIP region 104, the pixel area region 108, and the VSSEL contact region 106, and where the second metal layer 130 is formed between the first planarization layer 120 and the second planarization layer 140. A first trench 122 may be formed completely through the first planarization layer 120, with the second metal layer 130 formed along a lateral sidewall 124 of the first trench 120. A second trench 142 may be formed completely through the second planarization layer 140, with the first metal layer 150 formed along a lateral sidewall 144 of the second trench 142. In an embodiment, the first trench 122 and the second trench 142 extend a longitudinal length of the display panel 100 parallel to the GIP region 104. In an embodiment, the first trench 122 and the second trench 142 do not overlap, though they may overlap in other embodiments.

The display panel 100 may additionally include a PDL 160 over the first metal layer 150, the PDL 160 including an array of pixel openings 162 and a VSSEL contact opening 164. A spacer layer 168 may be formed on the PDL 160 and within the VSSEL contact region 106, and an organic capping layer 184 formed over the cathode layer 180. In an embodiment, the cathode layer 180 is formed over the PDL 160 and the array of pixel openings and within the VSSEL contact opening 164, and the organic capping layer 184 is formed on a single side of the spacer layer 168, such that the spacer layer 168 laterally confines the organic capping layer 184 away from the GIP region 104.

The display panel 100 may additionally include a first planarization layer 120 and a second planarization layer 140, in which both the first and second planarization layers 120, 140 span across the GIP region 104, the pixel area region 108, and the VSSEL contact region 106. A PDL 160 may be formed over the over the first metal layer 150, with the PDL including an array of pixel openings 162, a VSSEL contact opening 164, and a PDL valley 166 formed completely through the PDL 160 to expose the first metal layer 150 on a top surface of the second planarization layer 140. In an embodiment, the PDL valley 166 extends a longitudinal length of the display panel 100 parallel to the GIP region 104.

In an embodiment, a display panel 100 includes a GIP region 104, a pixel area region 108, and a VSSEL contact region 106 laterally between the outer edge 105 of the GIP region 104 and the pixel area region 108. A first metal layer 150 spans the VSSEL contact region 106 and the pixel area region 108, and includes an array of anode contacts 152 in the pixel area region 108 and a VSSEL contact layer 154 in the VSSEL contact region 106. A second metal layer 130 including a VSSEL line 132 spans the pixel area region 108, and the VSSEL contact layer 154 is in electrical contact with the VSSEL line 132. In an embodiment, the display panel includes a GIP clock region 103 within the GIP region 104, and the second metal layer 130 additionally includes GIP clock lines 135 in the GIP clock region 103. The second metal layer 130 may additionally include source-drain contacts 134 to transistors 114 in the GIP region 104, GIP signal lines 137, and/or a plurality of VSSEL lines 132 spanning the pixel area region 108. The VSSEL contact layer 154 may be in electrical contact with the plurality of VSSEL lines 132. For example, the plurality of VSSEL lines 132 may be connected by a landing area 133 of the second metal layer 130, and the VSSEL contact layer 154 may be formed on the landing area 133 in the VSSEL contact region 106. In an embodiment, the VSSEL contact layer 154 and the VSSEL line(s) 132 do not span directly over a transistor in the GIP region 104. In an embodiment, the VSSEL contact layer 154 and the VSSEL line(s) 132 do not span directly over a GIP clock line 135 in the GIP clock region 103.

The display panel 100 may additionally include a first planarization layer 120 and a second planarization layer 140, in which both the first and second planarization layers 120, 140 span across the GIP region 104, the pixel area region 108, and the VSSEL contact region 106, and where the second metal layer 130 is formed between the first planarization layer 120 and the second planarization layer 140. A first trench 122 may be formed completely through the first planarization layer 120, with the second metal layer 130 formed along a lateral sidewall 124 of the first trench 122. A second trench 142 may be formed completely through the second planarization layer 140, with the first metal layer 150 formed along a lateral sidewall 144 of the second trench 142. In an embodiment, the first trench 122 and the second trench 142 extend a longitudinal length of the display panel 100 parallel to the GIP region 104.

In an embodiment, a display panel 100 includes a GIP region 104, a pixel area region 108, and a VSSEL contact region 106 laterally between the outer edge 105 of the GIP region 104 and the pixel area region 108. A first metal layer 150 spans the VSSEL contact region 106 and the pixel area region 108, and includes an array of anode contacts 152 in the pixel area region 108 and a VSSEL contact layer 154 in the VSSEL contact region 106. A PDL 160 is formed over the first metal layer 150, and includes an array of pixel openings 162, a VSSEL contact opening 164, and a PDL valley 166 formed completely through the PDL 160 to expose the first metal layer 150. In an embodiment, the display panel 100 additionally includes a first planarization layer 120 and a second planarization layer 140, in which both the first and second planarization layers 120, 140 span across the GIP region 104, the pixel area region 108, and the VSSEL contact region 106, and the PDL valley 166 exposes the first metal layer 150 on a top surface of the second planarization layer 140. In an embodiment, the display panel 100 additionally includes a second metal layer 130 including a plurality of VSSEL lines 132 spanning the pixel area region 108, wherein the VSSEL contact layer 154 is in electrical contact with the plurality of VSSEL lines 132.

Figure 8:
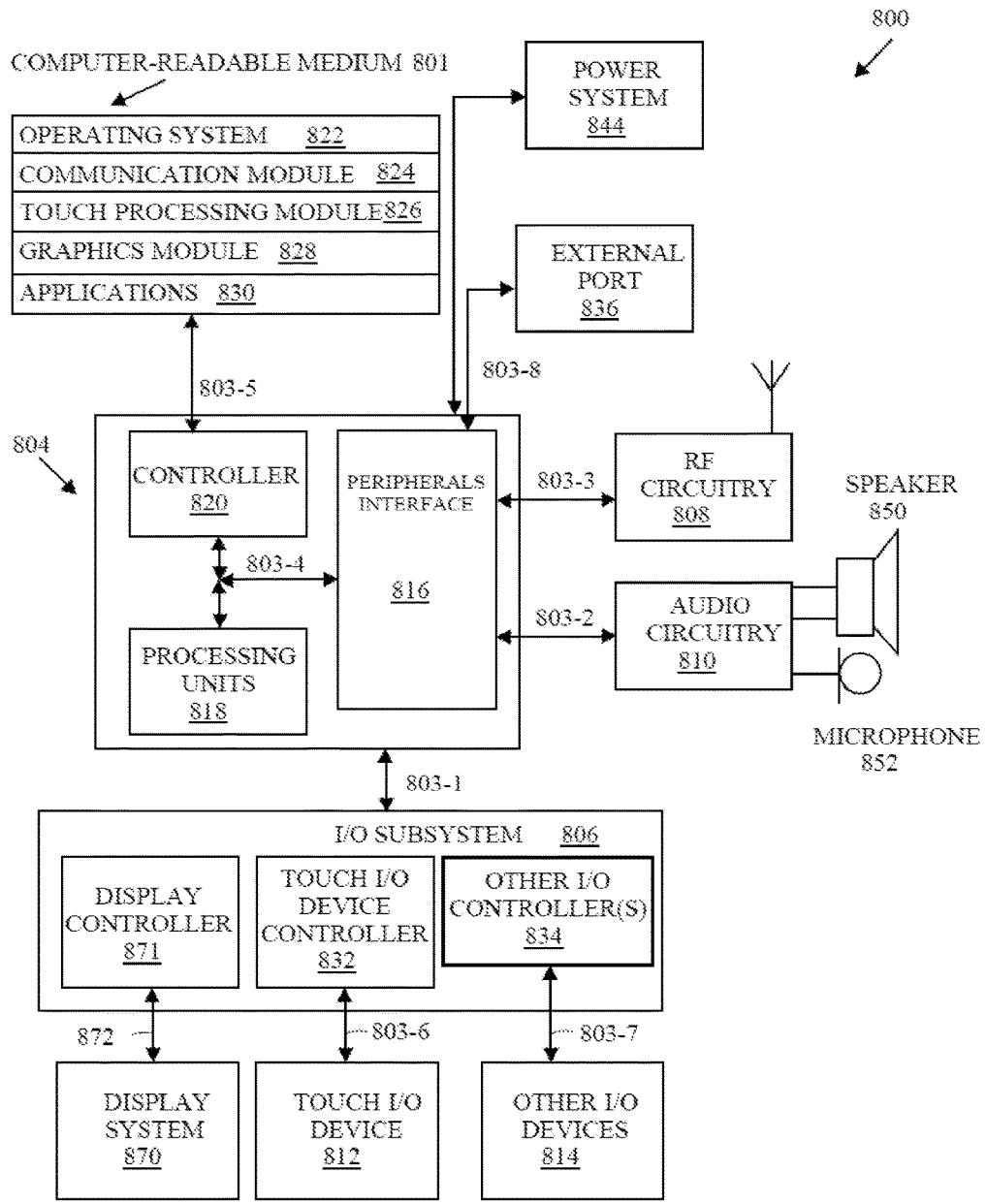
FIG. 8 is a block diagram of one embodiment of a system that generally includes one or more computer-readable mediums, processing system, Input/Output (I/O) subsystem, radio frequency (RF) circuitry and audio circuitry.
Figure 9:
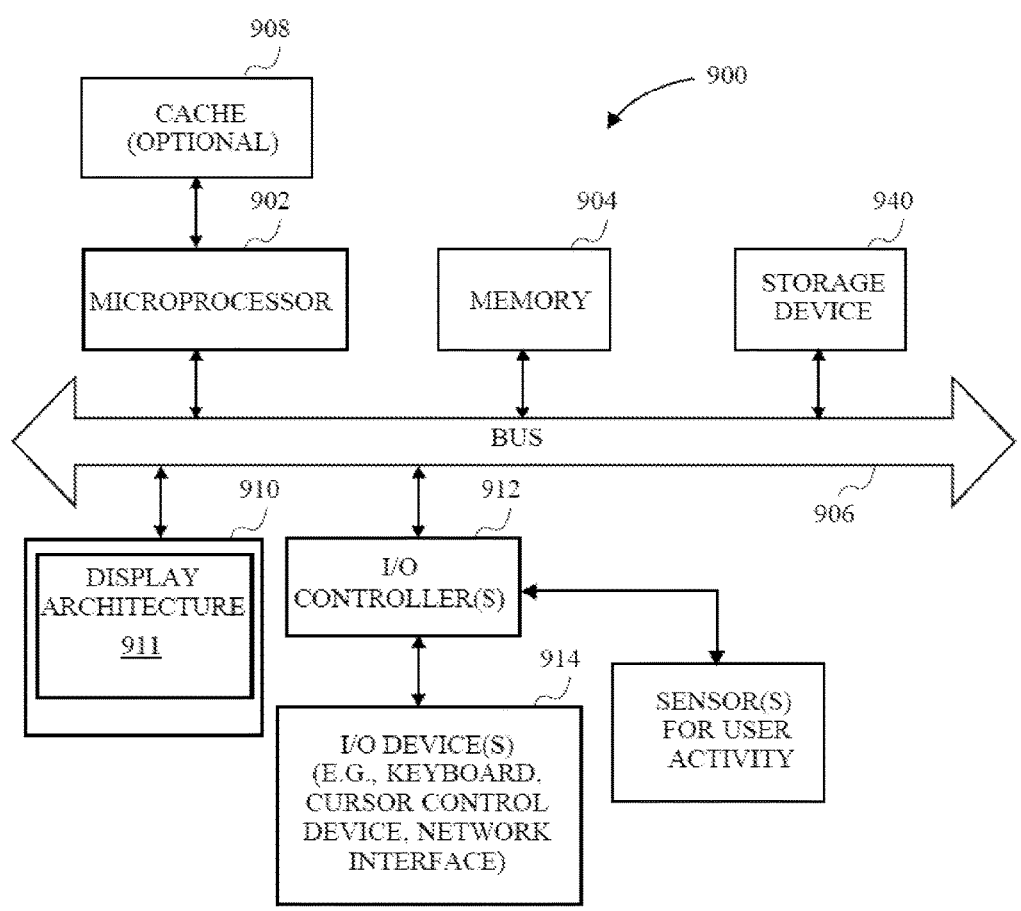
FIG. 9 shows another example of a device in accordance with an embodiment.

In some embodiments, the methods, systems, and display panels of the present disclosure can be implemented in various devices including electronic devices, consumer devices, data processing devices, desktop computers, portable computers, wireless devices, cellular devices, tablet devices, display screens, televisions, handheld devices, multi touch devices, multi touch data processing devices, wearable devices, any combination of these devices, or other like devices. FIG. 8 and FIG. 9 illustrate examples of a few of these devices.

Attention is now directed towards embodiments of a system architecture that may be embodied within any portable or non-portable device including but not limited to a communication device (e.g., mobile phone, smart phone, smart watch, wearable device), a multi-media device (e.g., MP3 player, TV, radio), a portable or handheld computer (e.g., tablet, netbook, laptop), a desktop computer, an All-In-One desktop, a peripheral device, a television, or any other system or device adaptable to the inclusion of system architecture, including combinations of two or more of these types of devices.

FIG. 8 is a block diagram of one embodiment of the system 800 that generally includes one or more computer-readable mediums 801, processing system 804, Input/Output (I/O) subsystem 806, radio frequency (RF) circuitry 808 and audio circuitry 810. These components may be coupled by one or more communication buses or signal lines 803 (e.g., 803-1, 803-2, 803-3, 803-4, 803-5, 803-6, 803-7, 808-8).

It should be apparent that the architecture shown in FIG. 8 is only one example architecture of system 800, and that system 800 could have more or fewer components than shown, or a different configuration of components. The various components shown in FIG. 8 can be implemented in hardware, software, firmware or any combination thereof, including one or more signal processing and/or application specific integrated circuits.

RF circuitry 808 is used to send and receive information over a wireless link or network to one or more other devices and includes well-known circuitry for performing this function. RF circuitry 808 and audio circuitry 810 are coupled to processing system 804 via peripherals interface 816. Interface 816 includes various known components for establishing and maintaining communication between peripherals and processing system 804. Audio circuitry 810 is coupled to audio speaker 850 and microphone 852 and includes known circuitry for processing voice signals received from interface 816 to enable a user to communicate in real-time with other users. In some embodiments, audio circuitry 810 includes a headphone jack (not shown).

Peripherals interface 816 couples the input and output peripherals of the system to processing units 818 and computer-readable medium 801. One or more processing units 818 communicate with one or more computer-readable mediums 801 via controller 820. Computer-readable medium 801 can be any device or medium (e.g., storage device, storage medium) that can store code and/or data for use by one or more processing units 818. Medium 801 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 801 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processing units 818 run various software components stored in medium 801 to perform various functions for system 800. In some embodiments, the software components include operating system 822, communication module (or set of instructions) 824, touch processing module (or set of instructions) 826, graphics module (or set of instructions) 828, and one or more applications (or set of instructions) 830. In some embodiments, medium 801 may store a subset of the modules and data structures identified above. Furthermore, medium 801 may store additional modules and data structures not described above.

Operating system 822 includes various procedures, sets of instructions, software components and/or drivers for controlling and managing general system tasks (e.g., memory management, storage device control, power management, etc.) and facilitates communication between various hardware and software components.

Communication module 824 facilitates communication with other devices over one or more external ports 836 or via RF circuitry 808 and includes various software components for handling data received from RF circuitry 808 and/or external port 836.

Graphics module 828 includes various known software components for rendering, animating and displaying graphical objects on a display surface. In embodiments in which touch I/O device 812 is a touch sensitive display (e.g., touch screen), graphics module 828 includes components for rendering, displaying, and animating objects on the touch sensitive display. The display panel 100 structures of the present design may be implemented with display system 870 which may be coupled with a display controller 871 via communication link 872.

One or more applications 830 can include any applications installed on system 800, including without limitation, a game center application, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS)), a music player, etc.

Touch processing module 826 includes various software components for performing various tasks associated with touch I/O device 812 including but not limited to receiving and processing touch input received from I/O device 812 via touch I/O device controller 832.

FIG. 9 shows another example of a device according to an embodiment of the disclosure. This device 900 may include one or more processors, such as microprocessor(s) 902, and a memory 904, which are coupled to each other through a bus 906. The device 900 may optionally include a cache 908 which is coupled to the microprocessor(s) 902. The device may optionally include a storage device 940 which may be, for example, any type of solid-state or magnetic memory device. Storage device 940 may be or include a machine-readable medium.

This device may also include a display controller and display device 910 which is coupled to the other components through the bus 906. The display panel 100 and mirror pixel layouts of the present design may be implemented in the display device 910 and display controller.

One or more input/output controllers 912 are also coupled to the bus 906 to provide an interface for input/output devices 914 and to provide an interface for one or more sensors 916 which are for sensing user activity. The bus 906 may include one or more buses connected to each other through various bridges, controllers, and/or adapters as is well known in the art. The input/output devices 914 may include a keypad or keyboard or a cursor control device such as a touch input panel. Furthermore, the input/output devices 914 may include a network interface which is either for a wired network or a wireless network (e.g. an RF transceiver). The sensors 916 may be any one of the sensors described herein including, for example, a proximity sensor or an ambient light sensor. In at least certain implementations of the device 900, the microprocessor(s) 902 may receive data from one or more sensors 916 and may perform the analysis of that data in the manner described herein.

In certain embodiments of the present disclosure, the device/system 900 or 800 or combinations of device/system 900/800 can be used to drive display data to a display device and implement at least some of the methods discussed in the present disclosure.

In utilizing the various aspects of the embodiments, it would become apparent to one skilled in the art that combinations or variations of the above embodiments are possible for forming a display panel with mirror pixels and power rail bridges. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
 a gate driver in panel (GIP) region, a GIP clock region within the GIP region, a pixel area region, and a negative supply electrode (VSSEL) contact region laterally between an outer edge of the GIP region and the pixel area region;
 one or more GIP clock lines in the GIP clock region;
 a first planarization layer spanning across the GIP region, the pixel area region, and the VSSEL contact region;
 a second metal layer on the first planarization layer and spanning across the GIP region on the first planarization layer;
 a second planarization layer over the first planarization layer and the second metal layer, the second planarization layer spanning across the GIP region, the pixel area region, and the VSSEL contact region;

a first metal layer spanning the VSSEL contact region and the pixel area region, the first metal layer including an array of anode contacts on the second planarization layer in the pixel area region and a VSSEL contact layer on the second planarization layer in the VSSEL contact region;

a pixel defining layer (PDL) over the first metal layer and spanning across the GIP region, the pixel area region, and the VSSEL contact region, the PDL including an array of pixel openings exposing the array of anode contacts; and a cathode layer over the PDL in the pixel area region and the VSSEL contact region, the cathode layer on the VSSEL contact layer in the VSSEL contact region, wherein an electrically conductive layer does not span over the GIP clock region between the second metal layer and the PDL.

2. The display panel of claim 1, wherein the second metal layer includes a VSSEL line spanning the pixel area region, wherein the VSSEL contact layer is in electrical contact with the VSSEL line.

3. The display panel of claim 2, wherein the second metal layer includes a plurality of VSSEL lines spanning the pixel area region, and the VSSEL contact layer is in electrical contact with the plurality of VSSEL lines.

4. The display panel of claim 2, wherein the VSSEL contact layer and the VSSEL line do not span directly over a GIP clock line in the GIP clock region.

5. The display panel of claim 4, wherein the VSSEL contact layer and the VSSEL line do not overlap the GIP region.

6. The display panel of claim 4, further comprising:
a first trench completely through the first planarization layer, wherein the second metal layer is formed along a lateral sidewall of the first trench; and
a second trench completely through the second planarization layer, wherein the first metal layer is formed along a lateral sidewall of the second trench.

7. The display panel of claim 6, wherein the first trench and the second trench extend a longitudinal length of the display panel parallel to the GIP region.

8. The display panel of claim 7, wherein the first trench and the second trench do not overlap.

9. The display panel of claim 1,
wherein the PDL comprises a VSSEL contact opening and a PDL valley formed completely through the PDL and exposing the first metal layer on a top surface of the second planarization layer, wherein the PDL valley extends a longitudinal length of the display panel parallel to the GIP region.

10. A display panel comprising:
a gate driver in panel (GIP) region, a pixel area region, and a negative supply electrode (VSSEL) contact region laterally between an outer edge of the GIP region and the pixel area region;
a first metal layer spanning the VSSEL contact region and the pixel area region, the first metal layer including an array of anode contacts in the pixel area region and a VSSEL contact layer in the VSSEL contact region;
a second metal layer including a VSSEL line spanning the pixel area region, wherein the VSSEL contact layer is in electrical contact with the VSSEL line;
a first planarization layer, and a second planarization layer, wherein both the first and second planarization layers span across the GIP region, the pixel area region, and the VSSEL contact region, and wherein the second metal layer is formed between the first planarization layer and the second planarization layer;
a pixel defining layer (PDL) over the second planarization layer, and spanning across the GIP region, the pixel area region, and the VSSEL contact region;
a first trench completely through the first planarization layer, wherein the second metal layer is formed along a lateral sidewall of the first trench; and
a second trench completely through the second planarization layer, wherein the first metal layer is formed along a lateral sidewall of the second trench;
wherein the first trench and the second trench extend a longitudinal length of the display panel parallel to the GIP region, and the first trench and the second trench do not overlap along the longitudinal length.

11. The display panel of claim 10, further comprising a GIP clock region within the GIP region, and wherein the second metal layer further includes one or more GIP clock lines in the GIP clock region.

12. The display panel of claim 11, wherein the second metal layer includes a plurality of VSSEL lines spanning the pixel area region, and the VSSEL contact layer is in electrical contact with the plurality of VSSEL lines.

13. The display panel of claim 12, wherein the VSSEL contact layer and the VSSEL line do not span directly over a GIP clock line in the GIP clock region.

14. A display panel comprising a gate driver in panel (GIP) region, a pixel area region, and a negative supply electrode (VSSEL) contact region laterally between an outer edge of the GIP region and the pixel area region;
a first metal layer spanning the VSSEL contact region and the pixel area region, the first metal layer including an array of anode contacts in the pixel area region and a VSSEL contact layer in the VSSEL contact region; and
a pixel defining layer (PDL) over the first metal layer, the PDL including an array of pixel openings, and a VSSEL contact opening, and a PDL valley formed completely through the PDL and exposing only the first metal layer.

15. The display panel of claim 14, further comprising:
a first planarization layer, and a second planarization layer, wherein both the first and second planarization layers span across the GIP region, the pixel area region, and the VSSEL contact region; and
wherein the PDL valley exposes the first metal layer on a top surface of the second planarization layer.

16. The display panel of claim 15, further comprising a second metal layer including a plurality of VSSEL lines spanning the pixel area region, wherein the VSSEL contact layer is in electrical contact with the plurality of VSSEL lines.

17. A display panel comprising:
a gate driver in panel (GIP) region, a pixel area region, and a negative supply electrode (VSSEL) contact region laterally between an outer edge of the GIP region and the pixel area region;
a first metal layer spanning the VSSEL contact region and the pixel area region, the first metal layer including an array of anode contacts in the pixel area region and a VSSEL contact layer in the VSSEL contact region;
a pixel defining layer (PDL) over the first metal layer, the PDL including an array of pixel openings, and a VSSEL contact opening;
a spacer layer on the PDL and within the VSSEL contact region, the spacer layer characterized by a GIP region side adjacent the GIP region opposite a pixel area region side adjacent the pixel area region;

a cathode layer over the PDL and the array of pixel openings, and within the VSSEL contact opening; and an organic capping layer over the cathode layer, wherein the organic capping layer is formed only on the pixel area region side of the spacer layer, such that the spacer layer laterally confines the organic capping layer away from the GIP region.

18. The display panel of claim 17, wherein the PDL includes a PDL valley formed completely through the PDL and exposing only the first metal layer.

19. The display panel of claim 18, further comprising a thin film encapsulation (TFE) layer over the GIP region, the pixel area region, and the VSSEL contact region, the TFE layer spanning over the organic capping layer, the PDL, and the spacer layer, wherein the TFE layer fills the PDL valley and is in direct contact with the first metal layer.

20. The display panel of claim 17, further comprising:
a first planarization layer, and a second planarization layer, wherein both the first and second planarization layers span across the GIP region, the pixel area region, and the VSSEL contact region;
a second metal layer on first planarization layer;
a first trench completely through the first planarization layer, wherein the second metal layer is formed along a lateral sidewall of the first trench; and
a second trench completely through the second planarization layer, wherein the first metal layer is formed along a lateral sidewall of the second trench;
wherein the first trench and the second trench extend a longitudinal length of the display panel parallel to the GIP region, and the first trench and the second trench do not overlap along the longitudinal length.

21. The display panel of claim 17, wherein the spacer layer completely surrounds the pixel area region.

* * * * *